United States Patent [19]
Schell et al.

[11] Patent Number: 5,915,979
[45] Date of Patent: Jun. 29, 1999

[54] ELECTRICAL CONNECTOR WITH STRESS ISOLATING SOLDER TAIL

[75] Inventors: Mark S. Schell, Palatine, Ill.; David J. Dutkowsky, Tokyo, Japan

[73] Assignee: Berg Technology, Inc., Reno, Nev.

[21] Appl. No.: 08/910,787

[22] Filed: Aug. 13, 1997

Related U.S. Application Data

[63] Continuation of application No. 08/535,452, Oct. 24, 1995, abandoned.

[51] Int. Cl.⁶ .................................................... H01R 9/09
[52] U.S. Cl. ............................................ 439/83; 439/326
[58] Field of Search ................... 439/62, 79, 80, 439/83, 495, 541.5, 326

[56] References Cited

U.S. PATENT DOCUMENTS

| | | | |
|---|---|---|---|
| 4,470,648 | 9/1984 | Davis et al. | 439/68 |
| 4,702,708 | 10/1987 | Reuss et al. | 439/83 |
| 4,722,691 | 2/1988 | Gladd et al. | 439/79 |
| 4,756,694 | 7/1988 | Billman et al. | 439/61 |
| 4,802,860 | 2/1989 | Kikuta | 439/79 |
| 4,955,820 | 9/1990 | Yamada et al. | 439/83 |
| 4,992,056 | 2/1991 | Douty et al. | 439/83 |
| 5,085,601 | 2/1992 | Buchter et al. | 439/660 |
| 5,122,066 | 6/1992 | Plossmer | 439/78 |
| 5,167,531 | 12/1992 | Broschard, III et al. | 439/541.5 |
| 5,176,523 | 1/1993 | Lai | 439/64 |
| 5,201,663 | 4/1993 | Kikuchi et al. | 439/83 |
| 5,387,112 | 2/1995 | Chishima | 439/67 |
| 5,393,234 | 2/1995 | Yamada et al. | 439/62 |

Primary Examiner—Neil Abrams
Attorney, Agent, or Firm—Herzog, Crebs & McGhee, LLP

[57] ABSTRACT

An upper and lower contact especially for a double-deck or dual in-line module, each includes a solder tail that is coupled to the main body of the contact by a compliant portion. The compliant portion is thus intermediate the main body and the solder portion of the solder tail. The compliant portion isolates and absorbs stresses induced on the module housing through card insertion such that the solder joint does not receive the stress. Additionally, the provision of a compliant portion absorbs non-linearities created by circuit board warpage on which the module is attached. The compliant portion may take the form of a modified spring, a U-shaped section, a radiused section, or other form.

7 Claims, 2 Drawing Sheets

ELECTRICAL CONNECTOR WITH STRESS ISOLATING SOLDER TAIL This is a continuation of application Ser. No. 08/535,452 filed Oct. 24, 1995 and now abandoned.

FIELD OF THE INVENTION

The present invention relates to electrical connectors and their associated terminals or contacts that are adapted to be mounted to a printed circuit board and, more particularly, to an improved electrical contact for an electrical connector.

BACKGROUND OF THE INVENTION

In electronic components of today, especially computers, various devices, add-ons, and peripherals are attached or interfaced with the computer or otherwise via electrical connectors. These connectors are usually mounted in some manner to printed circuit boards (PCB's) such that the attached device is electrically coupled thereto. In general, connectors are either surface mounted or through mounted to the circuit board. Additionally, some connectors accept printed circuit boards from the top (vertical insertion) while other connectors accept printed circuit boards from the side (horizontal insertion).

All of the connectors have a plurality of electrical terminals or contacts that are adapted to contact leads of the PCB of the attached device or a card containing components, and also to attach to the main PCB on which the connector is mounted.

The portion of the contacts that are attached to the circuit board is generally known as the solder tails. The solder tails are electrically coupled to the various circuits of the circuit board by soldering the ends of the solder tails to soldering pads located on the PCB. However, the point of soldering or connection is naturally a weak spot. During insertion of a card or circuit board into the connector, the insertion forces on the housing of the connector translate into forces or stress on the solder tail that strains the point of connection or soldering of the solder tail to the circuit board. Such stress can cause the solder tails to become detached from the PCB with the result that there is a break in the electrical connection between the connector and the PCB. This is especially true where the card or circuit board is horizontally received in the connector. In this case, the forces on the solder points (the soldered connection of the solder points of the solder tails and the solder pads of the PCB) are tangential resulting in a shearing effect. The repeated shearing stress weakens or ruptures the connection. Even connectors that receive cards or PCB's vertically experience forces during insertion and removal of the cards or PCB's such as to create shearing forces at the solder points. Additionally, PCB warpage or other stresses can be detrimental to the solder joints.

With the above in mind, it is an object of the present invention to provide an electrical connector adapted to receive a card or device PCB and mountable to a main printed circuit board, that includes contacts or terminals which absorb stress as a result of insertion or removal of a printed circuit board.

It is further an object of the present invention to provide a blanked or stamped contact for an electrical connector that is sturdy yet compliant for absorbing or isolating stress.

It is yet another object of the present invention to provide a double-deck in-line module (DDIM) or dual in-line module (DIM) for horizontal receipt of memory cards wherein the solder tails absorb or isolate stresses on the soldering joints as a result of card insertion and/or removal.

SUMMARY OF THE INVENTION

An electrical connector, such as a dual in-line module (DIM) or double-deck in-line module (DDIM) has contacts each of which includes a compliant section integrally formed in the solder tail. The compliant section is disposed between the main body of the contact and the attachment or soldering joint where the contact connects with the PCB.

In accordance with the present invention, the compliant section is a bend or spring-like portion that allows the housing of the module or connector to twist or bend without significantly disrupting the solder bond between the soldering joint of the solder tail and the solder pads of the printed circuit board. The compliant sections of the contacts act like shock absorbers to isolate the stresses from the soldering point by moving the stress out and away from the solder joints.

The contacts are blanked or stamped rather than formed in order to increase the co-planarity between the solder tails and the soldering points. A suitable electrically conducting metal is utilized for the contact stock.

Because of the compliant section and its compliance action, the solder attachment point is isolated from the stresses induced in the housing and transmitted along the solder tail of the contact towards the soldering point. The compliant section absorbs the movement caused by card insertion into and removal from the connector.

BRIEF DESCRIPTION OF THE DRAWINGS

So that the manner in which the above-recited features, advantages, and objects of the present invention are attained and can be understood in detail, a more particular description of the invention, briefly summarized above, may be had by reference to the embodiment thereof which is illustrated in the appended drawings.

It is noted, however, that the appended drawings illustrate only a typical embodiment of this invention and is therefore not to be considered limiting of its scope, for the invention may admit to other equally effective embodiments. Reference the appended drawings, wherein.

DETAILED DESCRIPTION

Figure 1:
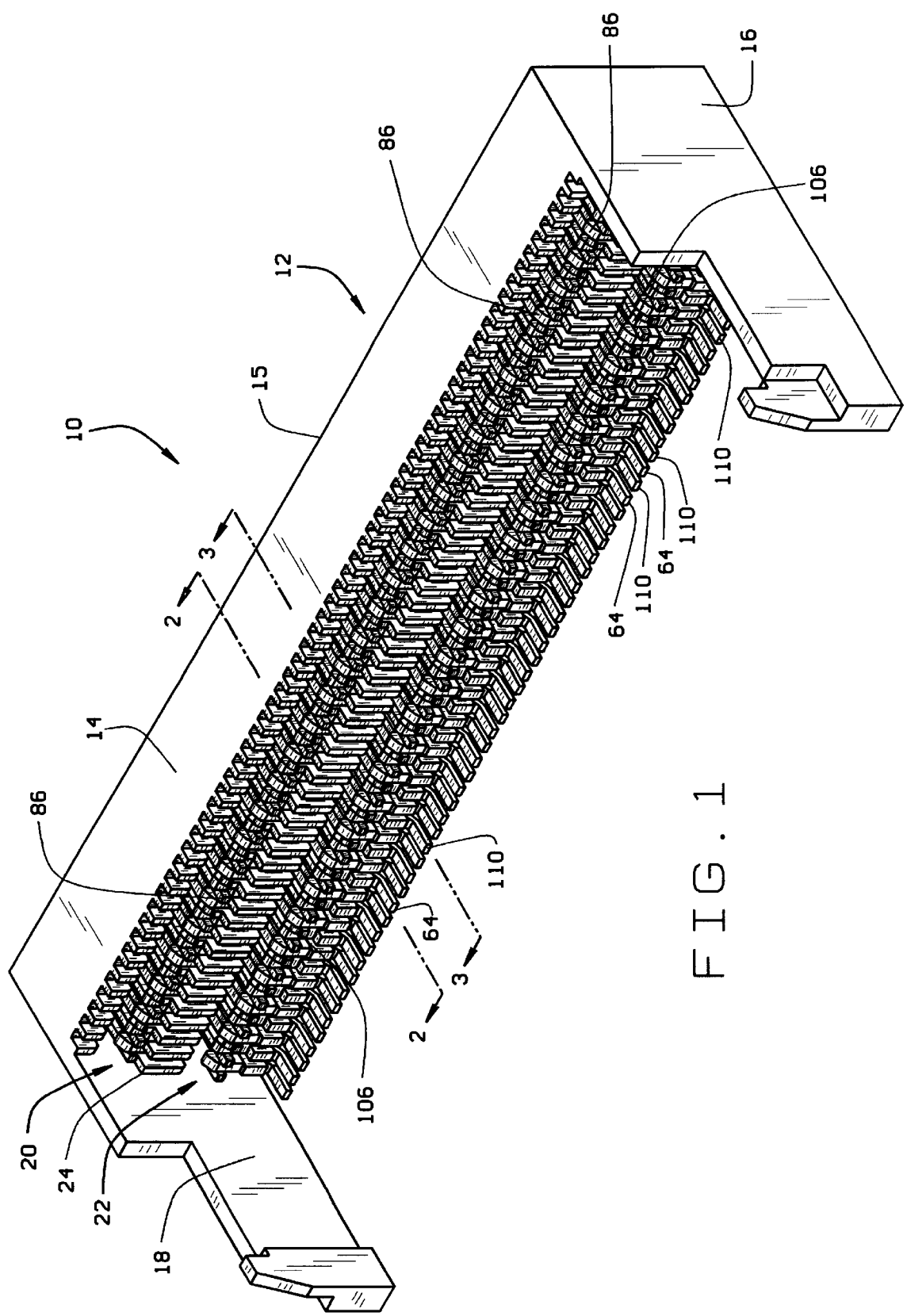
FIG. 1 is perspective view of a DDIM embodying the present invention.

Referring now to FIG. 1 there is shown a double-deck in-line module (DDIM) or dual in-line module (DIM) generally designated 10 (the module) such as are utilized for connecting memory cards or the like. The module 10 is designed to horizontally receive such cards. In keeping with the above, it should be understood that the applicability of the present invention is not limited to DDIM's or DIM's, but to all electrical connectors that are essentially "mounted" to a circuit board by their solder tails regardless of whether insertion of a card into the module is horizontal or vertical.

The module 10 is characterized by a plastic housing 12 defined by a longitudinal wall 12 having a longitudinal top portion 14 and a longitudinal rear portion 15. Integral with the longitudinal wall 12 is a right side wall 16 and a left side wall 18 that assist in guiding the cards into the module 10. It should be noted that while the housing 12 is preferably made of plastic, other suitable non-conductive materials may also be utilized. The housing 12 defines a top longitudinal row or channel 20 and a bottom longitudinal row or channel 22 that are separated by a middle partition 24.

Figure 2:
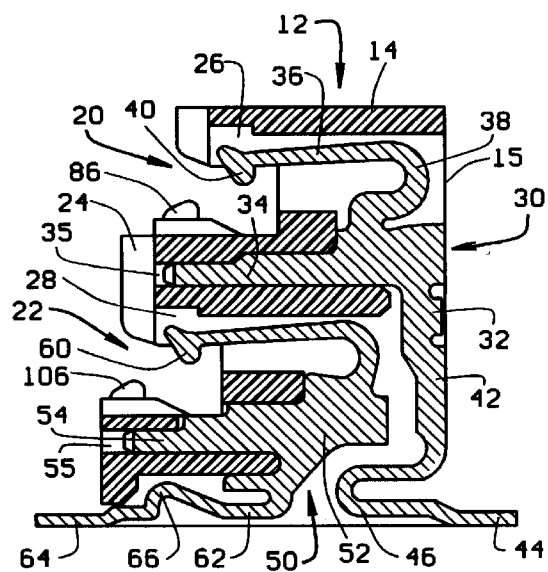
FIG. 2 is an enlarged sectional view of the DDIM taken along line 2—2 of FIG. 1 showing the upper contacts of the top and bottom longitudinal card or PCB receiving slots.

Referring in addition to FIG. 2, the housing 12 is shown in cross section. The top longitudinal channel 20 is adapted to receive the edge of a memory card or the like that generally carries memory chips (not shown) while the bottom longitudinal channel 22 is likewise adapted to receive the edge of a second memory card of the like (not shown). While not shown, the typical memory card is a printed circuit board (PCB) that carries various memory chips and related electrical components. The chips and components are coupled to leads that terminate in thin electrically conducting strips proximate one edge of the PCB of the memory card. On one side of the PCB the leads are laterally spaced apart from one another by an open strip of PCB. On the opposite side of the PCB, the leads are also laterally spaced apart from one another by an open strip of PCB. However, the leads on one side of the PCB are opposite the open strips of the other side of the PCB, with the leads on the other side of the PCB opposite the open strips of the one side of the PCB. In this manner, the leads of both sides are staggered along the edge of the PCB.

Figure 5:
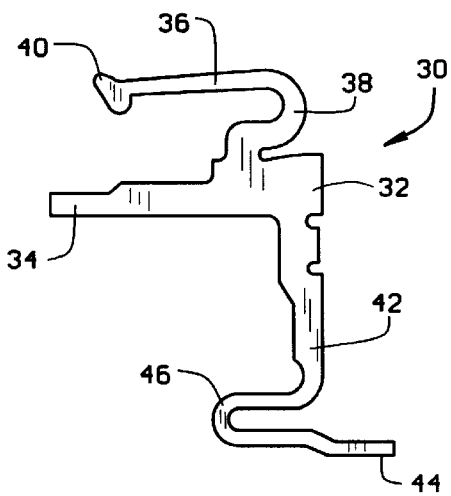
FIG. 5 is a side view of the upper contact for the top slot.

The top longitudinal channel 20 defines an upper surface area 26 for each of the plurality of upper contacts 30. Embedded in or molded into the housing 12 is a plurality of upper contacts of which in FIG. 2 only one such upper contact 30 is shown. Each upper contact 30 is adapted to provide electrical contact with respective upper leads (not shown) of the top memory card in the manner detailed below. Because each upper contact 30 is the same, only one such contact 30 will herein be described. The upper contact 30 is specifically shown in FIG. 5 and is characterized by a body 32, an integral anchoring or stabilizing leg 34, an integral terminal 36, and an integral solder tail 42. The entire upper contact 30 is blanked or stamped from a suitable conducting metal, coated or uncoated, to provide rigid edges and co-planarity of the solder tails.

The anchoring leg 34 is retained in a channel 35 within the housing 12 while the terminal 36 resiliently projects from the body 32 through a bend or spring portion 38 and terminates in a contact tip 40. The terminal 36 is positioned adjacent the upper surface 26 of the top longitudinal channel 20 with the contact tip 40 downwardly projecting therefrom. Because the terminal 36 is resiliently attached to the body 32, the protruding tip 40 is biased to make contact with the leads of the one side of the PCB (not shown) as the PCB is inserted into the top longitudinal channel 20. As best seen in FIG. 2, the solder tail 42 terminates exterior to the housing 12 in a solder point 44. The solder point 44 is that portion of the solder tail 42 that is soldered to a solder pad (not shown) that is disposed on the main PCB (not shown).

In accordance with the present invention, located between the body 32 and the solder point 44 of the contact 30 is a compliant section 46. The compliant section 46 absorbs and/or isolates stresses induced in the solder tail 42 that would ordinarily be transmitted to the solder point 44 and the solder pad (not shown). The compliant section 46 increases the solder tail flexibility or reduces the solder tail 46 stiffness as the stress point is moved away or out from the solder point 44 to the solder pad (not shown) junction. In the embodiment shown, the compliant section 46 is a sideways oriented U-shaped bend, but can be any type of spring shape or the like that accomplishes absorption and/or isolation of the forces or stresses induced in the housing during card insertion or through PCB warpage.

Figure 4:
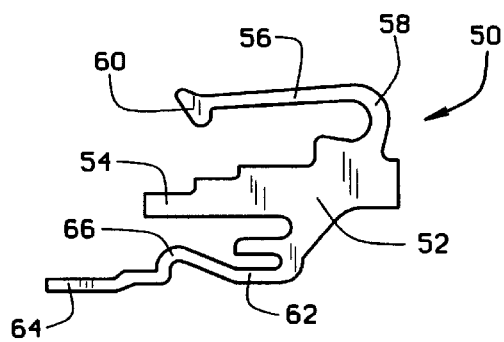
FIG. 4 is a side view of the upper contact for the bottom slot.

With reference again to FIG. 2, the bottom longitudinal channel 22 defines an upper surface area 28 for each of the plurality of upper contacts 50. In like manner to the upper contacts 30 of the top longitudinal channel 20, embedded in or molded into the housing 12 a plurality of upper contacts of which in FIG. 2 only one such upper contact 50 is shown of the bottom longitudinal channel 22. Each upper contact 50 is adapted to provide electrical contact with the respective upper leads (not shown) of a bottom memory card (not shown). Because each upper contact 50 is the same, only one such upper contact 50 will herein be described. The upper contact 50 is specifically shown in FIG. 4 and is characterized by a body 52, an integral anchoring or stabilizing leg 34, an integral terminal 56, and an integral solder tail 62. In like manner to the upper contact 30 of the top longitudinal channel 20, the upper contact 50 is blanked or stamped from a suitable conducting metal, coated or uncoated, to provide rigid edges and co-planarity of its solder tail.

The anchoring leg 54 is retained in a channel 55 within the housing 12 while the terminal 56 resiliently projects from the body 52 through a bend or spring portion 58 and terminates in a contact tip 60. The terminal 56 is positioned adjacent the upper surface 28 of the bottom longitudinal channel 22 with the contact tip 60 downwardly projecting therefrom. Because the terminal 56 is resiliently attached to the body 52, the protruding tip 60 is biased to make contact with the leads of the one side of the PCB (not shown) as the PCB is inserted into the bottom longitudinal channel 22. As best seen in FIG. 2, the solder tail 62 terminates exterior to the housing 12 in a solder point 64. The solder point 64 is that portion of the solder tail 62 that is soldered to a solder pad (not shown) that is disposed on the main PCB (not shown).

In accordance with the present invention, located between the body 52 and the solder point 64 of the contact 50 is a compliant section 66. The compliant section 66 absorbs and/or isolates stresses induced in the solder tail 62 that would ordinarily be transmitted to the solder point 64 and the solder pad (not shown). The compliant section 66 increases the solder tail flexibility or reduces the solder tail stiffness as the stress point is moved away or out from the solder point 64/solder pad junction (not shown). In the embodiment shown, the compliant section 66 is an upwards oriented essentially U-shaped bend, but can be any type of spring shape or the like that accomplishes absorption and/or isolation of the forces or stresses induced in the housing during card insertion or through PCB warpage.

Figure 3:
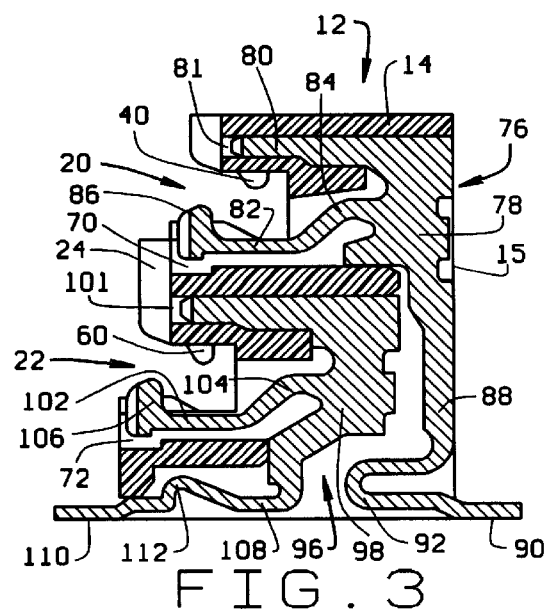
FIG. 3 is an enlarged sectional view of the DDIM taken along line 3—3 of FIG. 1 showing the lower contacts of the top and bottom longitudinal card or PCB receiving slots.

Both of the upper contacts 30 and 50 of the respective top and bottom longitudinal channels 20 and 22 are essentially flat conductors that lie in a common axial plane to form top and bottom pairs of upper contacts or terminals. As best seen in FIG. 1, there are a plurality of such top and bottom pairs of upper contacts disposed along the longitudinal length of the housing 12. Disposed between each upper contact pair 30, 50 in an alternating or staggered fashion are pairs of lower contacts 78 and 98 as best seen in FIG. 3. Both of the lower contacts 78 and 98 of the respective top and bottom longitudinal channels 20 and 22 are essentially flat conductors that lie in a common axial plane to form top and bottom pairs of lower contacts or terminals. Again, as best depicted in FIG. 1, there are a plurality of such top and bottom pairs of lower contacts disposed along the longitudinal length of the housing 12.

Figure 7:
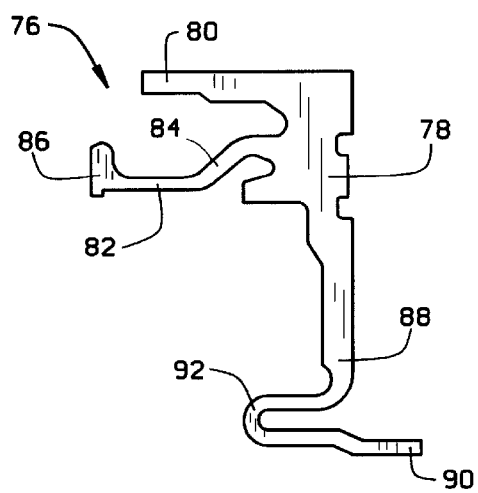
FIG. 7 is a side view of the lower contact for the top slot.

With specific reference to FIG. 3, the top longitudinal channel 20 has a lower surface area 70 for each of the plurality of lower contacts 76. Again, in like manner to the upper contacts 30 and 50, the lower contacts 76 are embedded in or molded into the housing 12 and are adapted to provide electrical contact with the lower respective leads (not shown) of a top memory card (not shown). Because each lower contact 76 is the same, only one such lower contact 76 will herein be described. The lower contact 76 is specifically shown in FIG. 7 and is characterized by a body 78, an integral anchoring or stabilizing leg 80, an integral terminal 82, and an integral solder tail 88. Again, in like manner to the upper contacts 30, 50, the lower contact 76 is blanked or stamped from a suitable conducting metal, coated or uncoated, to provide rigid edges.

The anchoring leg 80 is retained in a channel 81 within the housing 12 while the terminal 82 resiliently projects from the body 78 through a bend or spring portion 84 and terminates in an upwardly biased contact tip 86. The terminal 76 is positioned adjacent the lower surface 70 of the top longitudinal channel 20 with the contact tip 86 upwardly projecting therefrom. Because the terminal 82 is resiliently attached to the body 78, the protruding tip 86 is biased to make contact with the leads of the lower side of the PCB (not shown) as the PCB is inserted into the top longitudinal channel 20. As best seen in FIG. 3, the solder tail 88 terminates exterior to the housing 12 in a solder point 90.

Again, in accordance with the present invention, located between the body 78 and the solder point 90 of the contact 76 is a compliant section 92. The compliant section 92 absorbs and/or isolates stresses induced in the solder tail 88 that would ordinarily be transmitted to the solder point 90 and the solder pad (not shown). The compliant section 92 increases the solder tail flexibility or reduces the solder tail stiffness as the stress point is moved away or out from the solder point 90/solder pad junction (not shown). In the embodiment shown, the compliant section 92 is a sideways oriented U-shaped bend, but can be any type of spring shape or the like that accomplishes absorption and/or isolation of the forces or stresses induced in the housing during card insertion, PCB warpage or the like.

Figure 6:
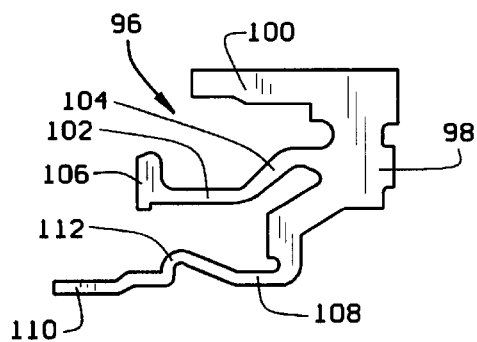
FIG. 6 is a side view of the lower contact for the bottom slot.

Again, with specific reference to FIG. 3, the bottom longitudinal channel 22 has a lower surface area 72 for each of the plurality of lower contacts 96. In like manner to the contacts 30, 50, and 76, each lower contact 96 is embedded in or molded into the housing 12 and is adapted to provide electrical contact with the lower leads (not shown) of a bottom memory card (not shown). Because each lower contact 96 is the same, only one such lower contact 96 will herein be described. The lower contact 96 is specifically shown in FIG. 6 and is characterized by a body 98, an integral anchoring or stabilizing leg 100, an integral terminal 102, and an integral solder tail 108. Again, in like manner to the other contacts 30, 50, and 76, the lower contact 96 is blanked or stamped from a suitable conducting metal, coated or uncoated, to provide rigid edges.

The anchoring leg 100 is retained in a channel 101 within the housing 12 while the terminal 102 resiliently projects from the body 98 through a bend or spring portion 104 and terminates in a contact tip 106. The terminal 96 is positioned adjacent the lower surface 72 of the bottom longitudinal channel 22 with the contact tip 106 upwardly projecting therefrom. Because the terminal 102 is resiliently attached to the body 98, the protruding tip 106 is biased to make contact with the leads of the lower side of the PCB (not shown) as the PCB is inserted into the bottom longitudinal channel 22. As best seen in FIG. 3, the solder tail 108 terminates exterior to the housing 12 in a solder point 110.

Again, in accordance with the present invention, located between the body 98 and the solder point 110 of the contact 96 is a compliant section 102. The compliant section 102 absorbs and/or isolates stresses induced in the solder tail 108 that would ordinarily be transmitted to the solder point 110 and the solder pad (not shown). The compliant section 112 increases the solder tail flexibility or reduces the solder tail stiffness as the stress point is moved away or out from the solder point 110/solder pad junction (not shown). In the embodiment shown, the compliant section 112 is an upwards oriented U-shaped bend, but can be any type of spring shape or the like that accomplishes absorption and/or isolation of the forces or stresses induced in the housing during card insertion, PCB warpage or the like.

With the type of module 10 as depicted in the Figures, the solder points of each contact is soldered to a solder pad in order to mount the module 10 and to make electrical contact with the various circuits on the main PCB. The memory cards are inserted and removed horizontally into the module 10 such that horizontal stresses caused by card insertion would tend to pull upwards on the solder points if the present compliance sections were not present. However, because the solder tails have such compliance sections, the stresses caused by insertion and removal are not translated to the solder points but are absorbed or isolated from the solder points. The module 10 can thus limitedly move during insertion or removal without appreciable stress upon the solder points so as to cause them to detach from the solder pads on the main PCB.

While the module 10 is shown as a surface mount type module, all types of electrical connectors can benefit from the present invention. It should also be noted that all of the contacts 30, 50, 78, and 98 are blanked or stamped rather than formed. By blanking the contacts, co-planarity of the solder tails and solder points is increased. Co-planarity is how flat or co-planar are the solder tails and soldering portions relative to each other. The compliant sections or compliance action is a part of the blanked part by virtue of the integral bends or springs.

The foregoing description of the present connector and its electrical contacts has indicated that the contacts or terminals are stamped or blanked. It should be understood that the contacts may likewise be molded or formed. The method of manufacture has no bearing on the innovation of a complaint section in the solder tail.

Likewise, there are equally effective ways to anchor or secure the contacts to or within the plastic housing other than by an anchoring leg as shown in the drawings. As is known in the art, the contacts are either molded with the housing or are inserted into the housing after fabrication. The contacts may be retained by any type of interference fit or by barbs located on the contact body or elsewhere.

While the foregoing is directed to the preferred embodiment of the present invention, other and further embodiments of the invention may be devised without departing from the basic scope thereof, and the scope thereof is determined by the claims which follow.

What is claimed is:

1. A dual in-line module comprising:
   a dielectric housing having a bottom elongated slot and a top elongated slot, each said slot defining a respective upper elongated surface and a lower elongated surface, said slots being essentially parallel, said housing defining a space internal thereto, bounded by said upper elongated surface of said top elongated slot, said lower elongated surface of said bottom elongated slot, and a pair of side walls;

a plurality of first blanked electrical contacts embedded in said housing, each of said first electrical contacts having a first body, a first terminal arm extending from and resiliently coupled to said first body and having at least a portion thereof protruding from said upper elongated surface of said top elongated slot into said to elongated slot, a first solder tail extending from said first body and terminating in a first soldering section external to said housing, and a first unrestrained compliant loop totally external to said housing and disposed between said first body and said first soldering section, said first unrestrained compliant loop adapted to absorb stresses induced in said first solder tail;

a plurality of second blanked electrical contacts embedded in said housing, each of said second electrical contacts having a second body, a second terminal arm extending from and resiliently coupled to said second body and having at least a portion thereof protruding from said lower elongated surface of said top elongated slot into said top elongated slot, a second solder tail extending from said second body and terminating in a second soldering section external to said housing, and a second unrestrained compliant loop totally external to said housing and disposed between said second body and said second soldering section, said second unrestrained compliant loop adapted to absorb stress induced in said second solder tail;

a plurality of third blanked electrical contacts embedded in said housing, each of said third electrical contacts having a third body, a third terminal arm extending from and resiliently coupled to said third body and having at least a portion thereof protruding from said upper elongated surface of said bottom elongated slot into said bottom elongated slot, a third solder tail extending from said third body and terminating in a third soldering section external to said housing, and a third unrestrained compliant loop totally external to said housing and disposed between said third body and said third soldering section, said third unrestrained compliant loop adapted to isolate stresses induced in said third solder tail; and a plurality of fourth blanked electrical contacts embedded in said housing, each of said fourth electrical contacts having a fourth body, a fourth resilient terminal arm extending from said fourth body and having at least a portion thereof protruding from said lower elongated surface of said bottom elongated slot into said bottom elongated slot, a fourth solder tail extending from said fourth body and terminating in a fourth soldering section external to said housing, and a fourth unrestrained compliant loop totally external to said housing and disposed between said fourth body and said fourth soldering section, said fourth unrestrained compliant loop adapted to isolate stress induced in said fourth solder tail.

2. The dual in-line module of claim 1, wherein said first and second terminal arms are alternatingly arranged along the longitudinal length of said top slot; and said third and fourth terminal arms are alternatingly arranged along the longitudinal length of said bottom slot.

3. The dual in-line module of claim 2, wherein said plurality of first and third terminal arms form axially aligned pairs, and said plurality of second and fourth terminal arms form axially aligned pairs.

4. The dual in-line module of claim 1, wherein said first and second unrestrained compliant loops are U-shaped, and said third and fourth unrestrained compliant loops are radiused bends.

5. A dual in-line module adapted to be mounted onto a circuit board, the module comprising:

a dielectric housing having an upper elongated slot and a lower elongated slot, each said slot defining a respective upper elongated surface and a lower elongated surface, said slots generally aligned in parallel, said housing defining a space internal thereto, bounded by said upper elongated surface of said top elongated slot, said lower elongated surface of said bottom elongated slot, and a pair of side walls; and a plurality of blanked electrical contacts, each contact defined by a planar body disposed in said housing, an arm coupled to an edge of said body and extending into one of said upper and lower elongated slots, a compliant portion coupled to and extending from and edge of said body, said compliant portion being entirely external of said housing, and a solder tail portion coupled to said compliant portion adapted to be connected to a circuit board.

6. The module of claim 5, wherein said plurality of contacts are divided into first and second pairs of contacts, said first pair of contacts having arms extending into said upper elongated slot and alternatingly displaced towards a top and bottom section of said upper elongated slot, said second pair of contacts having arms extending into said lower elongated slot and alternatingly displaced toward a top and bottom section of said lower elongated slot.

7. The module of claim 6, wherein said compliant portion of said first pair of contacts are loops, and said compliant portion of said second pair of contacts are radiused bends.

* * * * *